Dec. 15, 1970 J. A. ZAGUSTA 3,547,724

METHOD OF AND APPARATUS FOR PRODUCING PRINTED CIRCUITS

Filed Feb. 7, 1967 2 Sheets-Sheet 1

Inventor:
John A. Zagusta,
by Robert K. Churchill
Attorney

METHOD OF AND APPARATUS FOR PRODUCING PRINTED CIRCUITS

Filed Feb. 7, 1967 2 Sheets-Sheet 2

Inventor:
John A. Zagusta,
by Robert A. Churchill
Attorney

United States Patent Office 3,547,724
Patented Dec. 15, 1970

3,547,724

METHOD OF AND APPARATUS FOR PRODUCING PRINTED CIRCUITS

John A. Zagusta, Fort Lee, N.J., assignor to Rogers Corporation, Rogers, Conn., a corporation of Massachusetts Filed Feb. 7, 1967, Ser. No. 614,470
Int. Cl. B32b *31/18*
U.S. Cl. 156—233 2 Claims

ABSTRACT OF THE DISCLOSURE

Printed circuits are produced by laminating superimposed webs of metal foil and plastic film, die stamping the metal foil in a predetermined pattern, and removing unwanted metal foil from the formed lamina.

This invention relates to a method of and apparatus for producing printed circuits.

The invention has for an object to provide a novel and improved method of producing a printed circuit of the type embodying a relatively thin dielectric circuit carrying sheet or film having a conductive metal circuit pattern applied thereto in a rapid, efficient and continuous manner.

The invention has for a further object to provide novel and improved apparatus for producing a printed circuit of the character specified having provision for producing printed circuits during the continuous advance of the circuit carrying film and the conductive metal in an efficient and economical manner.

With these general objects in view and such others as may hereinafter appear, the invention consists in the method of and apparatus for producing printed circuits as hereinafter described and particularly defined in the claims at the end of this specification.

In the drawings illustrating the preferred embodiment of the invention:

Figures 1, 5:
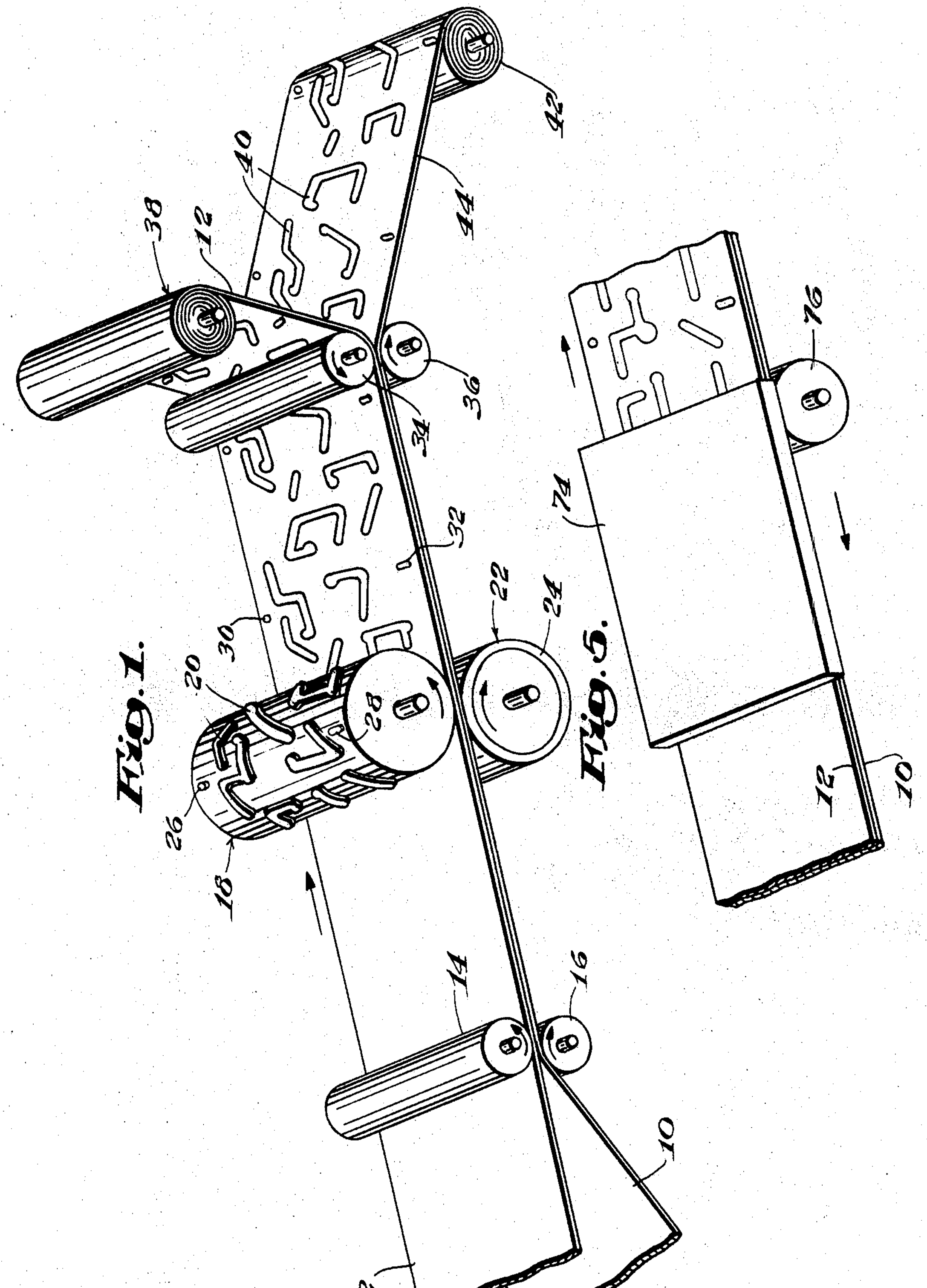
FIG. 1 is a perspective view of apparatus embodying a pattern cutting or stamping roll and a cooperating resilient roll for applying a metal foil circuit pattern to a thin base sheet and illustrating the steps in the method of producing the printed circuit in a continuous operation.
FIG. 5 is a perspective view of a modified form of apparatus for producing printed circuits during the continuous advance of the conductive foil and the thin base sheet.

In general, the present invention contemplates a method of and apparatus for producing printed circuits wherein the printed circuit comprises a relatively thin and flexible dielectric sheet or film comprising the base or circuit carrying member, and a metallic foil circuit pattern secured to the film. The relatively thin dielectric film comprises a synthetic fabric, such as Dacron or Orlon, which may be woven or unwoven and which is dipped or coated on both sides with a phenolic or other good commercially available electric grade resin providing a relatively thin flexible sheet or film having high dielectric properties. The relatively thin dielectric film can equally comprise a flexible plastic, rubber, or elastomeric film, tape or sheeting such as polyester, vinyl or neoprene. It could also be a felt or paper, either coated with an insulating resin or uncoated.

Prior to the present invention, it has been the practice to produce the printed circuit structure by placing a conductive metal foil sheet on and adhesively securing the same to a relatively thin film and then die-stamping the foil to cut a conductive circuit pattern from the foil sheet. In order to permit cutting of the foil without tearing the relatively thin circuit carrying film, the composite dielectric film and conductive foil was placed on a temporary flat base of resilient material, such as cork, rubber or the like which permitted yielding of the film material when the metallic foil pattern was cut, thus enabling the foil to be cut without damage to the thin dielectric film. Such prior method of producing a printed circuit is illustrated and described in a copending application assigned to the same assignee as the present application by Spiwak et al., Ser. No. 100,226, filed Apr. 3, 1961, now Pat. No. 3,301,-730, issued Jan. 31, 1967, wherein the die-cutting is performed in a conventional vertically reciprocable punch press having flat upper and lower die members, the upper die member having the circuit pattern engraved thereon. In such prior apparatus the die-cutting operation was necessarily intermittent to produce one printed circuit at a time, thus limiting the speed of production and economy of manufacture.

In accordance with one embodiment of the invention, provision is made for producing the printed circuits in a continuous operation wherein an elongated strip of dielectric film having a strip of conductive foil superimposed thereon is continuously advanced between a pair of cooperating heated rolls where the adhesive coated confronting faces of the two strips are combined by the heat and pressure of the rolls. The combined strips are then passed between continuously rotated cooperating pattern cutting rolls comprising an upper roll provided with die-stamping or cutting projections, and a lower roll having a resilient facing whereby the upper roll is enabled to cut the conductive metal pattern from the foil without damage to the circuit carrying film by virtue of the resiliency of the lower roll facing. Simultaneously with the die-cutting operation, spaced indexing or registration openings extending through and along the marginal edges of the film are provided for use in indexing the pattern carrying film for subsequent operations, such as for adding components, perforating or for cutting the strip into individual printed circuit sheets. In practice, the thin dielectric film with the conductive pattern delineated thereon may be secured to a relatively rigid insulating base.

The advantages of the present invention are that greater processing speeds are possible because of the continuous production operation afforded by the die-cutting rolls. Also, high unit die-cutting pressures are possible along the line of contact of the rolls as compared to the die-stamping process utilizing flat punch and die elements as described in the Spiwak et al. application above referred to. It is also possible to utilize apparatus of greatly reduced size and requiring substantially less floor space than the prior apparatus, and such apparatus may be manufactured at less cost than the apparatus for producing individual printed circuits utilizing flat dies.

In practice, successive revolutions of the pattern cutting roll provide successive duplicate lengths of printed circuits. Alternatively, the periphery of the upper roll may be provided with two or more different die-cutting patterns providing a plurality of different printed circuits each rotation of the pattern cutting roll.

After the rotary die-stamping operation is completed, the unwanted foil is separated from the pattern carrying sheet in a continuous operation and wound up on a roll. Likewise, the pattern carrying film may be wound up into roll form. In practice, the pattern carrying film may be conveniently stored in roll form for future use.

In a modified form of the invention, the die-cutting operation is performed by a combination of a flat die-cutting plate and a cooperating resilient roll wherein the die-cutting plate is moved along with the foil and film strip for a short distance during which time the resilient roll in engagement with the underside of the plate is moved rearwardly to effect the pattern cutting operation during the continuous advance of the film. In operation, the flat plate is then elevated and retracted to engage a succeeding section of the film and foil while the cooperating resilient roll is moved forwardly to again engage the underside of the plate to effect a succeeding cutting operation.

Referring now to the drawings and particularly to FIG. 1, 10 represents a relatively thin elongated strip of dielectric film, and 12 represents a thin elongated strip of conductive metal foil superimposed on the film 10. The pattern carrying film 10 comprises a plastic material comprising a synthetic fabric, such as Orlon, Dacron or the like, and having a phenolic resin coating on both sides thereof providing a composite relatively thin, tough, flexible pattern carrying film which is capable of yielding relative to the metal foil strip during the pattern cutting operation to prevent tearing thereof. The relatively thin dielectric film can equally comprise a flexible plastic, rubber, or elastomeric film, tape or sheeting such as polyester, vinyl or neoprene. It could also be a felt or paper, either coated with an insulating resin or uncoated. In practice, the plastic film will range in thickness from .001" to .020" and may be coated on one side thereof with a pressure sensitive or heat sensitive adhesive. The thickness of the meal foil may vary between .0005" to .005" and may be also provided with a coating of heat or pressure sensitive adhesive on one side thereof. In operation, the strips of thin dielectric film 10 and conductive metal foil 12 may be withdrawn from supply rolls, not shown.

As illustrated in FIG. 1, in accordance with one method of producing the printed circuit in a continuous operation, the superimposed film and foil strips having a coating of adhesive on at least one of their confronting surfaces are first passed between a pair of cooperating heated combining rolls 14, 16 where the strips are caused to adhere to each other by virtue of the heat and pressure applied thereto. In practice, the temperature of the heated rolls may be between 150° F. to 350° F. During the continued advance of the adhesively combined strips, the composite strip is passed between die-stamping or pattern cutting rolls comprising an upper roll 18 having a raised pattern 20 engraved thereon, and a lower roll 22 which is provided with a resilient facing 24 of rubber, felt, compressed paper or the like. In practice, a resilient facing comprising a reinforced rubber belting material sold under the trade name of "Fabreeka" was found to be suitable for this purpose. Engraved portions may also be provided in the periphery of the upper roll 18 for marking the combined materials for identification purposes. Also, the periphery of the roll 18 may be provided with die-cutting portions 26, 28 for perforating spaced registration openings 30, 32 in the marginal edges of the strips. In practice, the rolls 18, 22 operate at an ambient temperature and are arranged to be pressed together with a controlled force.

As a result of the die-cutting operation, a conductive pattern of metal foil is cut from the strip 12 without injury to the tough, flexible base material or pattern carrying film 10, and during continued advance of the combined materials, they pass between guide rolls 34, 36 where the unwanted metal foil 12 is stripped from the pattern carrying film and wound up on a roll 38. Likewise, the film with its conductive pattern 40 applied thereto is also wound up on a roll 42 in a convenient form for future use wherein the pattern carrying film 44 may be unwound and indexed by means of the marginal registration openings through mechanisms for cutting the successive duplicate printed circuits into units or for other purposes, such as adding components, perforating or the like.

In a modified form of the present invention, the heated combining or adhering rolls 14, 16 may be eliminated, and the upper roll 18 comprising the engraved pattern roll may be heated to secure adhesion of the superimposed foil and film during the stamping operation.

Figures 2, 3, 4:
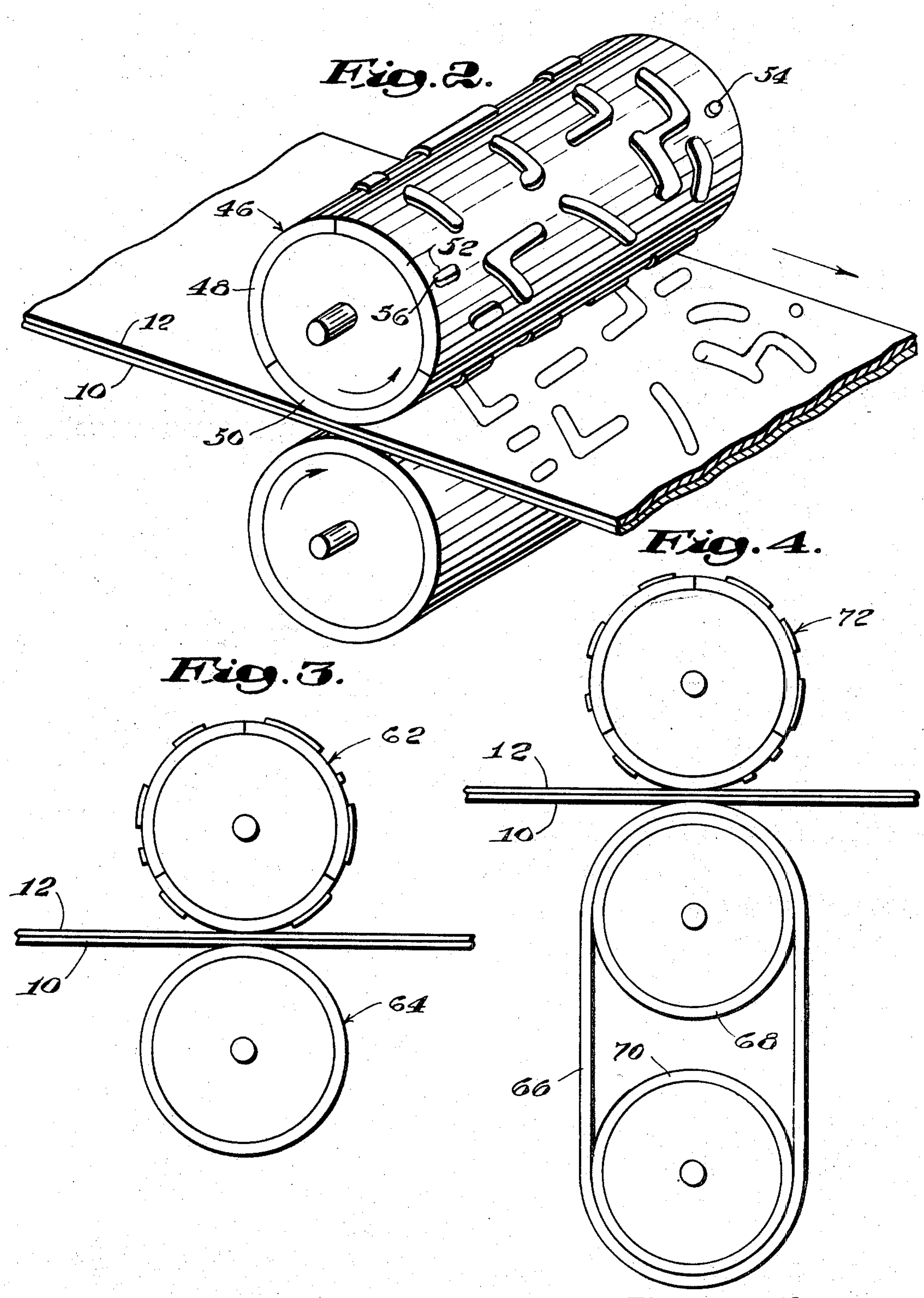
FIG. 2 is a perspective view illustrating a modified form of a pattern cutting or die-stamping roll adapted for use in producing printed circuits during the continuous advance of the conductive metal foil and the thin base sheet.
FIG. 3 is an end view of a modified form of the cooperating die-stamping rolls to be described.
FIG. 4 is an end view of another modified form of die-stamping apparatus wherein the lower yieldable element takes the form of an endless belt.

Referring now to FIG. 2, in a modified form of the invention, the upper or die-stamping roll 46 may be made up of several arcuate plates, herein shown as three plates indicated at 48, 50 and 52, each having a different pattern engraved thereon for cutting a plurality of printed circuits each revolution of the die-stamping roll. The roll 46 may also be provided with marginal punch elements 54, 56 for producing the spaced indexing openings 58, 60 as shown.

In a modified form of the invention illustrated in FIG. 3, the die-stamping roll 62 and the resilient roll 64 may be made of different diameters, say in the ratio of 12 to 13 for example, the rolls being driven at the inverse speed ratio of 13 to 12 to achieve the same peripheral speed for both rolls. This expedient avoids repeated impressions in the same place on the resilient roll 64, thus extending the useful life of the resilient roll. For the same purpose, the expedient illustrated in FIG. 4 wherein the resilient member comprises a closed or endless loop of belting 66 which is guided over rolls 68, 70 for cooperation with the die-stamping roll 72.

Referring now to FIG. 5, in a modified form of apparatus for die-cutting successive printed circuits during the continuous advance of the superimposed plastic film 10 and conductive foil 12, the rollers 18, 22 shown in FIG. 1 may be replaced with a combination of flat engraved plate 74 and a cooperating resilient roll 76. In operation, the die-cutting plate 74 is moved along with the combined strip for a short distance during which time the resilient roll 76 in engagement with the underside of the material is moved rearwardly pressing the material against the engraved stamping plate 74 to effect the pattern cutting operation during the continuous advance of the film. In operation, the materials may be first combined by means of the heated rolls 14, 16 in which case the die-stamping plate 74 operates at an ambient temperature, or the combining rolls 14, 16 may be eliminated in which case the die-stamping plate may be heated.

From the above description it will be seen that the present invention provides a novel and improved method of and apparatus for producing printed circuits in a rapid economical and continuous operation.

It will be understood that in practice the thin dielectric film embodying a curable resin and with the conductive metal circuit pattern adhesively secured thereto may be subsequently cured by placing the assembly in a mold and subjecting the assembly to heat and pressure to permanently bond the metal foil circuit pattern to the flexible film. This operation may be performed after the strip has been cut into individual circuit carrying sheets. The cured sheet may then be bonded to a relatively rigid insulating base, such as a moldable fibrous insulating sheet embodying a curable resin which lends itself to molding operations in which it may be formed and cured. The relatively thin circuit carrying film may also be used with advantage in the production of a multicircuit printed structure embodying a plurality of superimposed individual circuit patterns having provision for connecting selected of the circuit patterns. In practice, the superimposed circuit carrying films may be adhesively secured to each other and mounted on a relatively rigid insulating base to provide a multicircuit printed structure.

While the preferred embodiment of the invention has been herein illustrated and described, it will be understood that the invention may be embodied in other forms within the scope of the following claims.

Having thus described the invention, what is claimed is:

1. Apparatus for producing electrical circuits from an elongated flexible plastic insulating film strip and an elongated thin conductive metal foil strip, at least one of said strips having an adhesive coating on a confronting face thereof, said apparatus comprising:

means for continuously advancing said foil and insulating film strips;

means for registering and laminating said continuously advancing strips, said laminating means producing temporary adhesive bonding of the strips to one another;

means for simultaneously die-stamping the metal foil strip and perforating the insulating film during the continuous advance of the laminate to provide registration holes in and repetitive conductive metal circuit patterns supported on the insulating plastic film strip, said die-stamping and perforating means including:

an upper engraved pattern cutting roll, said cutting roll defining the circuit patterns and perforating punches;

a belt of resilient material defining a closed loop which cooperates with said pattern cutting roll to form a resilient base against which said foil is stamped; and spaced rollers for driving said resilient belt and for maintaining said belt in operative relation to the upper engraved roll; and means for separating the portions of said foil strip which do not define the desired circuit patterns from the insulating strip.

2. Apparatus for producing printed circuits of the character described in a continuous operation, means for continuously advancing a lower plastic strip and an upper metal foil strip in superimposed relation, at least one of said strips having a coating of adhesive on a confronting face thereof, means for applying heat and pressure during the continuous advance of the superimposed strips to cause adherence of the same, means for die-stamping the metal foil to provide a conductive circuit pattern on said plastic strip comprising a flat engraved upper plate adapted to be moved along with the combined strips for a short distance, and a lower resilient roll adapted to engage and traverse the underside of the flat plate with sufficient pressure to effect the cutting operation, said plate being elevated and retracted longitudinally to be lowered and engaged with a succeeding section of the strips, said resilient roll also movable longitudinally to effect the succeeding die-cutting operation, and means for separating an unwanted foil from the conductive pattern carrying film.

References Cited

UNITED STATES PATENTS

| | | | |
|---|---|---|---|
| 2,969,300 | 1/1961 | Franz | 156—233 |
| 3,032,463 | 5/1962 | Morgan | 156—253 |
| 3,072,519 | 1/1963 | Salzman | 156—253X |
| 3,320,109 | 5/1967 | Braner | 156—257X |

VERLIN R. PENDEGRASS, Primary Examiner

U.S. Cl. X.R.

156—253, 257